United States Patent

Arnold et al.

[11] Patent Number: 6,151,693
[45] Date of Patent: Nov. 21, 2000

[54] AUTOMATED METHOD OF BURN-IN AND ENDURANCE TESTING FOR EMBEDDED EEPROM

[75] Inventors: Robert H. Arnold, Bethlehem; Richard D. Bell; Ross A. Kohler, both of Allentown; Richard J. McPartland, Nazareth; Paul K. Wheeler, Allentown, all of Pa.

[73] Assignee: Lucent Technologies, Inc., Murray Hill, N.J.

[21] Appl. No.: 09/099,776

[22] Filed: Jun. 19, 1998

[51] Int. Cl.[7] .............................. G11C 29/00; G11C 7/00
[52] U.S. Cl. ............................. 714/718; 365/201
[58] Field of Search .................................. 714/718, 724, 714/726, 733, 734, 31, 42; 365/201, 200

[56] References Cited

U.S. PATENT DOCUMENTS

| | | | |
|---|---|---|---|
| 4,873,705 | 10/1989 | Johnson | 714/719 |
| 5,073,891 | 12/1991 | Patel | 714/720 |
| 5,355,369 | 10/1994 | Greenbergerl et al. | 714/726 |
| 5,675,546 | 10/1997 | Leung | 365/201 |

*Primary Examiner*—Trinh L. Tu
*Attorney, Agent, or Firm*—Dickstein Shapiro Morin & Oshinsky LLP

[57] ABSTRACT

An on-chip processor is used as a controller for burn-in and endurance testing of embedded non-volatile memory. An automated test machine downloads a test program into the non-volatile memory. The downloaded program contains a test program to be run on the non-volatile memory. When the burn-in or endurance test equipment activates the processor, the processor executes the program and performs a test on the non-volatile memory. The same method can be utilized to perform either the burn-in or endurance tests. Only the clock and reset lines are required to operate the test. Since the clock and reset lines are part of the processor's standard inputs, the method performs burn-in and endurance testing of an embedded non-volatile memory without bringing out the memory's address, data and control lines to the package pins of the integrated circuit. Since the clock and reset lines are part of the standard burn-in and endurance test equipment, the method also performs the testing without the use of expensive burn-in or endurance test equipment.

31 Claims, 3 Drawing Sheets

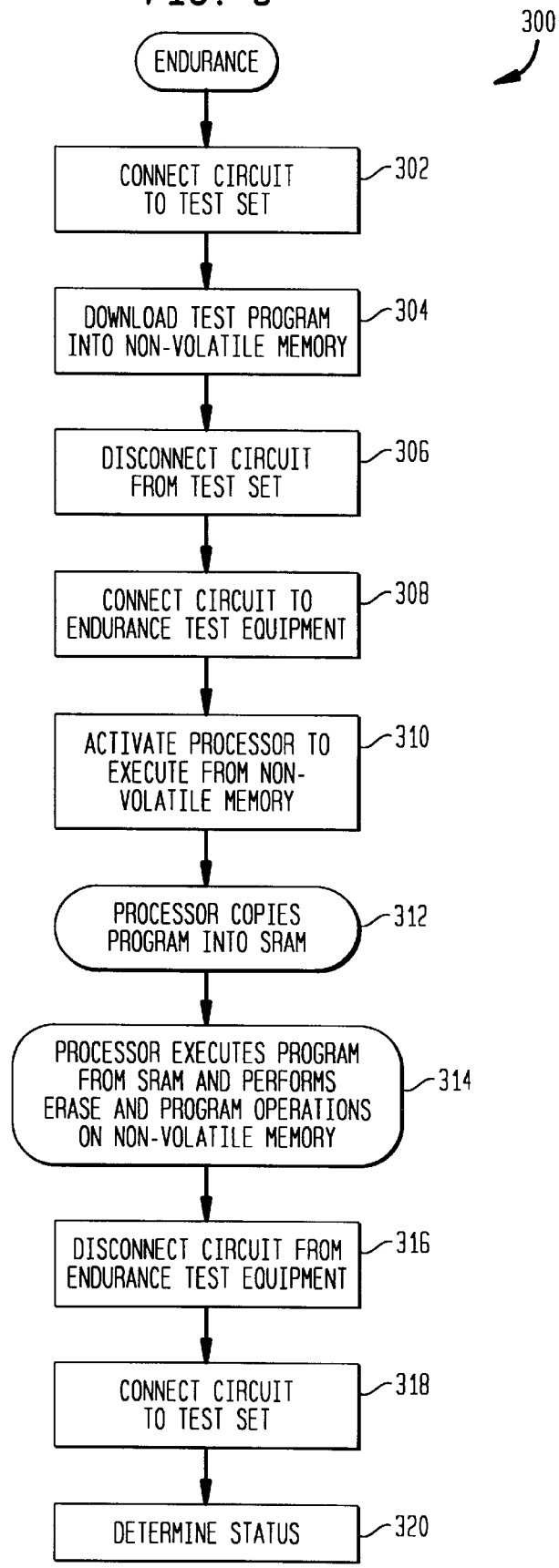

AUTOMATED METHOD OF BURN-IN AND ENDURANCE TESTING FOR EMBEDDED EEPROM

BACKGROUND OF THE INVENTION

1. Field of the Invention

This invention relates generally to the testing of memory devices and, more particularly, to an automated method of burn-in and endurance testing of non-volatile memory.

2. Description of the Prior Art

Upon completion of the manufacturing process, testing is usually performed to detect manufacturing defects in an integrated circuit. Traditionally, testing is performed on a commercial test machine by either probing the semiconductor wafer itself (prior to packaging into a chip) or testing a completed part through its package pins. The type of test performed, whether on the wafer or on the completed chip, is dependent upon the type of integrated circuit. For example, a non-volatile memory circuit will undergo memory testing to ensure the proper operation of the non-volatile memory. As is well known in the art, non-volatile memory retains its stored data even after the power is removed from the circuit. Examples of non-volatile memory include electrically programmable read only memory (EPROM), electrically erasable programmable read only memory (EEPROM) and flash EPROM.

A complex integrated circuit contains a mixture of logic and memory devices. Due to this mixture, the complex circuit requires the testing of all of the logical and the memory devices to ensure its proper operation. FIG. 1 illustrates a block diagram of an integrated circuit 100 having embedded non-volatile memory 104 and a processor 102. The circuit 100 also includes static random access memory (SRAM) 106. The processor 102, non-volatile memory 104 and the SRAM 106 are connected to each other by a bus 110. The bus 110 has sufficient address, data and control lines such that the processor 102 can communicate with the non-volatile memory 104 and the SRAM 106. As part of the manufacturing process of the completed part (i.e., the chip), connections to external devices are brought out to the package pins (e.g., the clock and reset lines illustrated in FIG. 1). The testing of the embedded non-volatile memory 104 now follows.

One conventional method of testing non-volatile memory 104 is to perform a burn-in test. A burn-in test is used to establish whether the non-volatile memory 104 will break down and become ineffective after being placed under a continuous high stress condition such as an elevated operating temperature.

Generally, a burn-in test is performed by connecting the integrated circuit 100 having the embedded non-volatile memory 104 to a test board and then placing the test board into a burn-in oven. Once in the oven, the circuit's 100 temperature is elevated and its non-volatile memory 104 is exercised by test equipment within the oven. During the burn-in test, the entire non-volatile memory 104 is exercised by continuous read operations (also referred to as "read cycles") for a period of time. The time period varies and is adjusted to meet the desired specifications of the integrated circuit 100. Upon completion of the burn-in test, the test board is removed from the burn-in oven. The non-volatile memory 104 is subsequently tested by another test unit or "test set" to determine if the stress of the burn-in test exposed any defects.

A second conventional method of testing non-volatile memory 104 is by endurance testing. As is well known in the art, non-volatile memories "wearout" (i.e., become ineffective after a limited number of programming and erase operations). The endurance test is used to establish whether the non-volatile memory 104 is capable of undergoing at least a predefined number of erase and programming operations. The predefined number of erase and programming operations varies and is adjusted to meet the desired specifications of the integrated circuit 100.

Generally, an endurance test is performed by connecting the integrated circuit 100 having the non-volatile memory 104 to a test board and then alternately performing erase and programming operations on the memory 104 for a predetermined number of endurance cycles (where an endurance cycle is the completion of one erase operation followed by one programming operation). Upon completion of the endurance test, the non-volatile memory 104 is subsequently tested by a test set to determine if there is premature wearout, or other defects, in the non-volatile memory 104.

SUMMARY OF THE INVENTION

This invention provides a method of burn-in and endurance testing of embedded non-volatile memory that does not require expensive burn-in or endurance test equipment, while alleviating the need to bring out the memory's address, data and control lines to the package pins of the integrated circuit.

The above features and advantages are achieved by using the on-chip processor as a controller for burn-in and endurance testing of embedded non-volatile memory. An automated test machine downloads a test program into the non-volatile memory. The downloaded program contains a test program to be run on the non-volatile memory. When the burn-in or endurance test equipment activates the processor, the processor executes the program and performs a test on the non-volatile memory. The same method can be utilized to perform either the burn-in or endurance tests. Only the clock and reset lines are required to operate the test. Since the clock and reset lines are part of the processor's standard inputs, the method performs burn-in and endurance testing of an embedded non-volatile memory without bringing out the memory's address, data and control lines to the package pins of the integrated circuit. Since the clock and reset lines are part of the standard burn-in and endurance test equipment, the method also performs the testing without the use of expensive burn-in or endurance test equipment.

BRIEF DESCRIPTION OF THE DRAWINGS

The foregoing and other advantages and features of the invention will become more apparent from the detailed description of the preferred embodiments of the invention given below with reference to the accompanying drawings in which:

FIG. 3 illustrates in flowchart form a method of performing endurance testing of an embedded non-volatile memory according to the present invention.

DETAILED DESCRIPTION OF THE PREFERRED EMBODIMENTS

Although the conventional methods of testing non-volatile memory work well, they have some drawbacks. For example, standard burn-in and endurance testing equipment have only two test signals, reset and clock, while the embedded non-volatile memory has numerous address, data and control lines. In order to drive these numerous lines, the manufacturer must bring the lines out to the package pins (or the wafer bond pads) of the integrated circuit. This is undesirable since the more lines brought out to the package pins (or wafer bond pads) increases the size and cost of the completed part. In addition, the manufacturer is also be required to modify the standard test equipment or purchase expensive and much more complex equipment to receive and drive the lines brought out to the pins.

Therefore, there is a need and desire for an automated method of burn-in and endurance testing for embedded memories that does not require expensive burn-in or endurance test equipment while also alleviating the need of bringing out the memory's address, data and control lines to the package pins of the integrated circuit. Accordingly, the present invention provides a method of burn-in and endurance testing of embedded non-volatile memory that does not require expensive burn-in or endurance test equipment, while alleviating the need to bring out the memory's address, data and control lines to the package pins of the integrated circuit.

The present invention supports the testing of electrically erasable programmable read only memory (EEPROM), flash EPROM and combinations of these memories as well as other non-volatile memory circuits generally known in the art.

Figure 1:
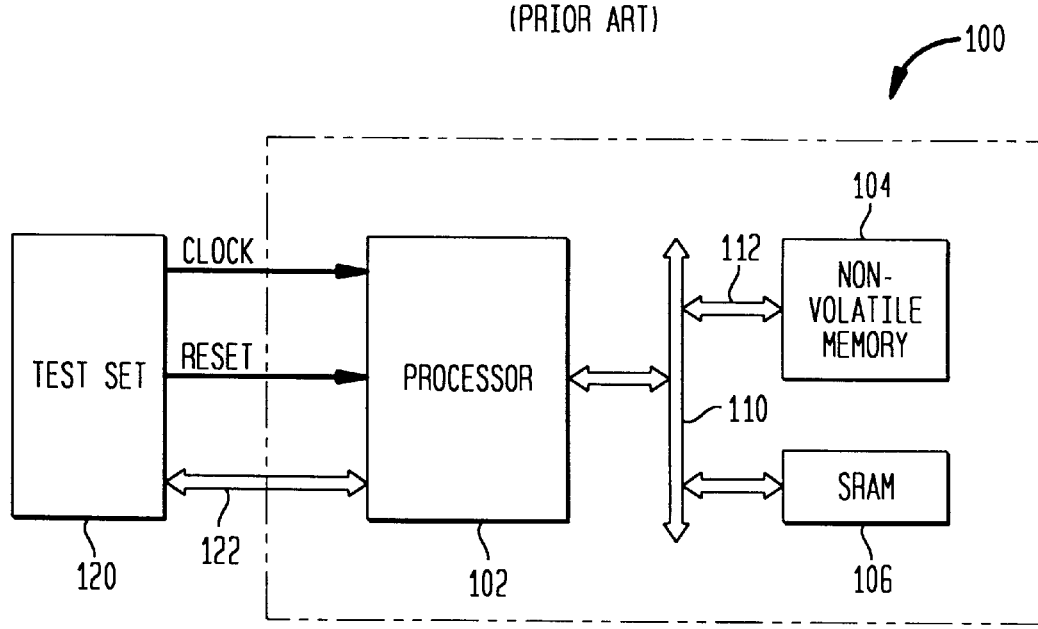
FIG. 1 illustrates a block diagram of an integrated circuit having embedded non-volatile memory.
Figure 2:
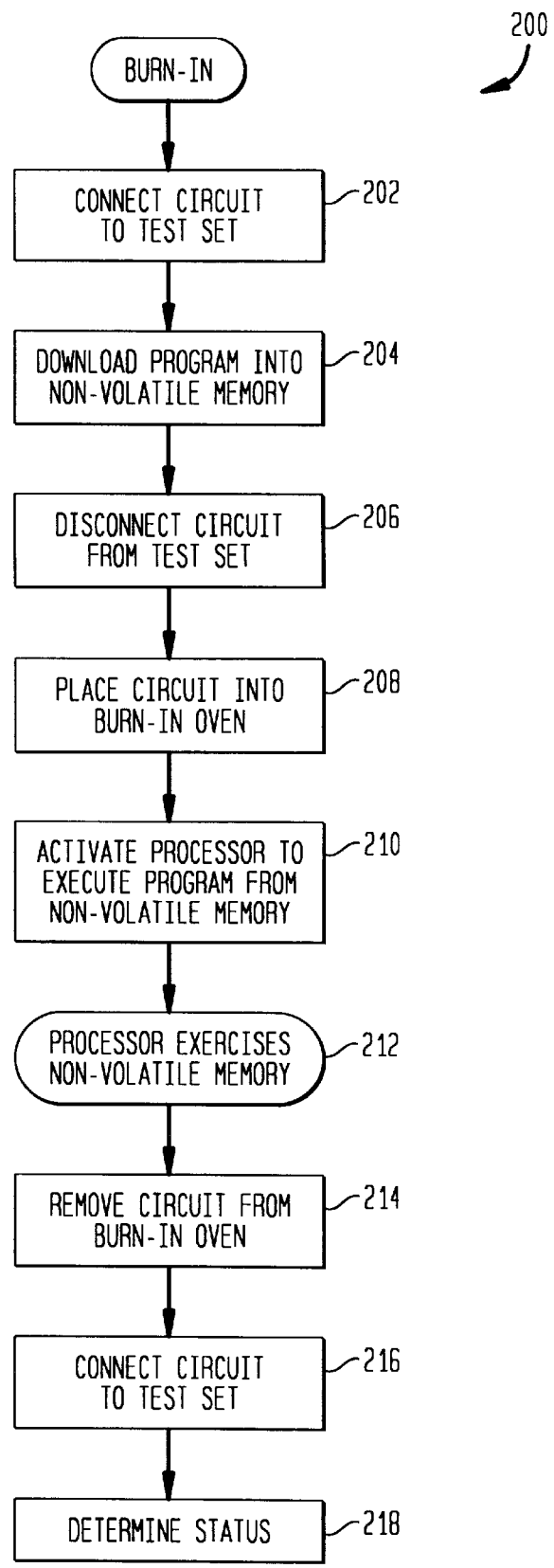
FIG. 2 illustrates in flowchart form a method of performing burn-in testing of an embedded non-volatile memory according to the present invention.

Referring to FIGS. 1 and 2, a method 200 of performing a burn-in test on an embedded non-volatile memory 104 in accordance with the present invention is as follows. The method 200 uses the on-chip processor 102 as a controller for the burn-in test. An automated test machine downloads a test program into the non-volatile memory 104. The downloaded program contains the burn-in test to be run on the non-volatile memory 104. When the burn-in test equipment activates the processor 102, the processor 102 executes the program to perform the burn-in test on the non-volatile memory 104. Only the clock and reset lines are required to operate the test. Since the clock and reset lines are part of the processor's 102 standard inputs, the method 200 performs burn-in testing of the embedded non-volatile memory 104 without bringing out the memory's 104 address, data and control lines 112 to the package pins of the integrated circuit 100. Since the clock and reset lines are part of the standard burn-in test equipment, the method 200 also performs the testing without the use of expensive equipment.

The first step 202 of the method 200 is to connect the circuit 100 to a test set 120. The test set 120 will include a commercially available test machine adapted to receive and test integrated circuits 100. The circuit 100 may be preparatively mounted on a test board prior to the connection to the test machine if required. The test machine must be capable of downloading a program into the non-volatile memory 104 of the integrated circuit 100. Preferably, the test set will have the capability to download a program with the use of a Joint Test Action Group (JTAG) test port 122. The use of a JTAG test port 122 to quickly download a program is described in detail in U.S. Pat. No. 5,355,369 (Greenbergerl et al.) which is hereby incorporated by reference in its entirety.

The next step 204 is to download the test program into the non-volatile memory 104 of the circuit 100. Once the program has been downloaded, the circuit 100 can be disconnected from the test set 120 (step 206). At this point, the non-volatile memory 104 contains the burn-in test program which can be executed directly from the memory 104 by the processor 102. A typical burn-in test program allows the processor 102 to perform numerous read operations on the memory 104 for a test period. If the circuit 100 is not already on a test board, it is mounted on a test board prior to performing the next step of the method 200.

In step 208, the circuit 100 is placed into the burn-in oven. The processor's 102 reset and clock lines are connected to the test equipment within the oven. Using reset and clock signals, the burn-in oven activates the processor 102 which in turn begins to execute the program directly from the non-volatile memory 104 (step 210). During this time, the burn-in oven is elevating the circuit's 100 temperature while the non-volatile memory 104 is being exercised by the processor 102 (step 212). As stated above, the entire non-volatile memory 104 is exercised by continuous read operations for a test period of time. The time period varies and is adjusted to meet the desired specifications of the integrated circuit 100. Upon completion of the burn-in test, the circuit 100 is removed from the burn-in oven (step 214).

The method 200 continues at step 216 where the circuit 100 is once again connected to the test set 120. Once connected to the test set, the non-volatile memory 104 is tested by any known method to determine if the stress of the burn-in test exposed any defects. Therefore, a burn-in test has been run without the use of expensive burn-in test equipment and without bringing the memory's 104 address, data and control lines 112 out to the package pins of the integrated circuit 100.

Referring to FIGS. 1 and 3, a method 300 of performing an endurance test on an embedded non-volatile memory 104 in accordance with the present invention is as follows. The method 300 uses the on-chip processor 102 as a controller for the endurance test. An automated test machine downloads a test program into the non-volatile memory 104. The downloaded program contains the endurance test to be run on the non-volatile memory. When the endurance test equipment activates the processor 102, the processor 102 executes the program to perform the endurance test on the non-volatile memory 104. Only the clock and reset lines are required to operate the test. Since the clock and reset lines are part of the processor's 102 standard inputs, the method 300 performs endurance testing of the embedded non-volatile memory 104 without bringing out the memory's 104 address, data and control lines 112 to the package pins of the integrated circuit 100. Since the clock and reset lines are part of the standard endurance test equipment, the method 300 also performs the testing without the use of expensive equipment.

The first step 302 of the method 300 is to connect the circuit 100 to a test set 120. The test set 120 will include the same features as described with reference to the method 200 illustrated in FIG. 2. The next step 304 is to download the test program into the non-volatile memory 104 of the circuit 100 (by use of the JTAG test port 122). Once the program has been downloaded, the circuit 100 can be disconnected from the test set 120 (step 306). At this point, the non-volatile memory 104 contains the endurance test program. The program is initially executed from the non-volatile 104, but is immediately copied into the SRAM 106. The remainder of the endurance test is executed by the processor 102 directly from the SRAM 106 because the endurance test continuously erases and programs the non-volatile memory 104 (which would prohibit the processor 102 from executing the program directly from the non-volatile memory 104). If the circuit 100 is not already on a test board, it is mounted on a test board prior to performing the next step of the method 300.

In step 308, the circuit 100 is connected to the endurance test equipment. The processor's 102 reset and clock lines are connected to the test equipment. Using reset and clock signals, the test equipment activates the processor 102 which in turn begins to execute the program directly from the non-volatile memory 104 (step 310). Initially, however, the processor 102 copies the remainder of the test program into the SRAM 106 for the reasons previously stated (step 312). The processor 102 then continues to execute the endurance test from the SRAM 106. During this time, in step 314, the processor 102 is alternately performing erase and programming operations on the memory 104 for a predetermined number of endurance cycles (where an endurance cycle is the completion of one erase operation followed by one programming operation). The number of cycles varies and is adjusted to meet the desired specifications of the integrated circuit 100. Upon completion of the endurance test, the circuit 100 is disconnected from the endurance test equipment (step 316).

The method 300 continues at step 318 where the circuit 100 is once again connected to the test set 120. Once connected to the test set 120, the non-volatile memory 104 is tested by any known method to determine if there is premature wearout, or other defects, in the non-volatile memory 104 (step 320). Therefore, an endurance test has been run without the use of expensive endurance test equipment and without bringing the memory's 104 address, data and control lines 112 out to the package pins of the integrated circuit 100.

Although the methods 200, 300 have been described with reference to a single integrated circuit 100, it must be noted that the methods 200, 300 can operate on as many circuits 100 that the test equipment is capable of handling. In addition, it must be noted that SRAM 106 can be any form of random access memory (RAM) including dynamic random access memory (DRAM) and other well known RAM variants. It must be noted that the processor 102 can be a microprocessor, a digital signal processor, a micro-controller or any other device capable of controlling the non-volatile memory 104 and SRAM 106.

While the invention has been described in detail in connection with the preferred embodiments known at the time, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the invention. Accordingly, the invention is not to be seen as limited by the foregoing description, but is only limited by the scope of the appended claims.

What is claimed as new and desired to be protected by Letters Patent of the United States is:

1. A method of testing an integrated circuit having a memory array, said circuit including a processor communicating with said memory array, the method comprising the steps of:
   downloading a program into at least a portion of said memory array, said program for performing a test consisting of one of a burn-in test and an endurance test on said memory array; and
   operating said processor with only two control signals such that it executes said program to perform said test on said memory array.

2. The method according to claim 1 wherein said memory array is a non-volatile memory array.

3. The method according to claim 1 wherein said memory array is a flash EPROM memory array.

4. The method according to claim 1 wherein said memory array is an EEPROM memory array.

5. The method according to claim 1 wherein said test performed on said memory array is said burn-in test and wherein said integrated circuit is placed into a burn-in test apparatus prior to operating said processor.

6. The method according to claim 5 wherein said burn-in test performs numerous read operations of said memory array for a test period.

7. The method according to claim 1 wherein said test performed on said memory array is said endurance test.

8. The method according to claim 7 wherein said processor copies said program into a second memory array prior to executing said endurance test and wherein said processor executes said program from said second memory array.

9. The method of claim 8 wherein said endurance test performs a number of alternating erase and programming operations of said memory array.

10. The method according to claim 1 wherein said step of operating said processor is performed by an external test unit connected to said integrated circuit.

11. The method according to claim 1 wherein said step of downloading said program is performed by an external test unit connected to said integrated circuit.

12. The method according to claim 1 wherein said processor is a digital signal processor.

13. The method according to claim 1 wherein said processor is a microprocessor.

14. A method of producing a test system for testing an integrated circuit comprising:
   providing a memory array on a semiconductor device;
   loading a program into at least a portion of said memory array, said program for performing a test consisting of one of a burn-in test and an endurance test on said memory array; and
   providing a processor on the semiconductor device, said processor communicating with said memory array, wherein said processor is operated by only two control signals to execute said program to perform said test on said memory array.

15. The method according to claim 14 wherein the step of loading a program into said memory array is performed by an external test unit connected to said integrated circuit.

16. The method according to claim 14 wherein said memory array is a non-volatile memory array.

17. The method according to claim 14 wherein said memory array is a flash EPROM memory array.

18. The method according to claim 14 wherein said memory array is an EEPROM memory array.

19. The method according to claim 14 wherein said processor is a digital signal processor.

20. The method according to claim 14 wherein said processor is a microprocessor.

21. The method according to claim 14 further comprising:
   providing a burn-in test apparatus, said integrated circuit residing on said burn-in test apparatus, and wherein said program executed by said processor is said burn-in test.

22. The method according to claim 14 further comprising:
   providing an endurance test apparatus, said integrated circuit residing on said endurance test apparatus, and wherein said program executed by said processor is said endurance test.

23. A system for testing an integrated circuit having an embedded memory on a processor, said system comprising:

a memory array, said memory array including a program for performing a test consisting of one of a burn-in test and an endurance test on said memory array; and a processor, said processor communicating with said memory array, wherein said processor is operated by only two control signals to execute said program to perform said test on said memory array.

24. The system according to claim 23 further comprising a test unit connected to said integrated circuit, wherein said test unit loads said program into said memory array.

25. The system according to claim 23 wherein said memory array is a non-volatile memory array.

26. The system according to claim 23 wherein said memory array is a flash EPROM memory array.

27. The system according to claim 23 wherein said memory array is an EEPROM memory array.

28. The system according to claim 23 wherein said processor is a digital signal processor.

29. The system according to claim 23 wherein said processor is a microprocessor.

30. The system according to claim 23 further comprising:

a burn-in test apparatus, said integrated circuit residing on said burn-in test apparatus, and wherein said program executed by said processor is said burn-in test.

31. The system according to claim 23 further comprising:

an endurance test apparatus, said integrated circuit residing on said endurance test apparatus, and wherein said program executed by said processor is said endurance test.

* * * * *